(12) United States Patent
Alakuijala et al.

(10) Patent No.: US 10,431,616 B2
(45) Date of Patent: Oct. 1, 2019

(54) COLOR FILTER ARRAYS FOR IMAGE SENSORS

(71) Applicant: Google LLC, Mountain View, CA (US)

(72) Inventors: Jyrki A. Alakuijala, Wollerau (CH); Zoltan Szabadka, Wollerau (CH)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/849,158

(22) Filed: Dec. 20, 2017

(65) Prior Publication Data
US 2019/0189661 A1    Jun. 20, 2019

(51) Int. Cl.
*H01L 27/146*    (2006.01)

(52) U.S. Cl.
CPC .. *H01L 27/14621* (2013.01); *H01L 27/14609* (2013.01); *H01L 27/14683* (2013.01)

(58) Field of Classification Search
CPC .............. H01L 27/14621; H04N 9/045; H04N 9/04515
See application file for complete search history.

(56) References Cited

U.S. PATENT DOCUMENTS

| | | | |
|---|---|---|---|
| 4,721,999 A | 1/1988 | Takemura et al. | |
| 5,914,749 A | 6/1999 | Bawolek et al. | |
| 6,593,558 B1 | 7/2003 | Edgar | |
| 6,697,110 B1 | 2/2004 | Jaspers et al. | |
| 6,759,646 B1 | 7/2004 | Acharya et al. | |
| 7,057,654 B2 | 6/2006 | Roddy et al. | |
| 8,258,560 B1 | 9/2012 | Hynecek | |
| 2007/0024931 A1 | 2/2007 | Compton et al. | |
| 2009/0295973 A1 | 12/2009 | Oshikubo et al. | |
| 2011/0279705 A1 | 11/2011 | Kuang et al. | |
| 2017/0111618 A1* | 4/2017 | Hsieh | G02B 3/005 |
| 2018/0277580 A1* | 9/2018 | Chiang | H01L 27/14621 |

OTHER PUBLICATIONS

'en.wikipedia.org' [online] "Bayer filter," Available on or before Nov. 26, 2017, [retrieved on Feb. 13, 2018] Retrieved from Internet: URL<https://en.wikipedia.org/wiki/Bayer_filter> via the Wayback Machine at Internet URL<https://web.archive.org/web/20171126121722/https://en.wikipedia.org/wiki/Bayer_filter> 4 pages.

(Continued)

*Primary Examiner* — Daniel P Shook
(74) *Attorney, Agent, or Firm* — Fish & Richardson P.C.

(57) ABSTRACT

Methods, systems, apparatus, including computer-readable media storing executable instructions, for color filter arrays for image sensors. In some implementations, an imaging device includes a color filter array arranged to filter incident light. The color filter array has a repeating pattern of color filter elements. The color filter elements include yellow filter elements, green filter elements, and blue filter elements. The imaging device includes an image sensor having photosensitive regions corresponding to the color filter elements. The photosensitive regions are configured to respectively generate electrical signals indicative of intensity of the color-filtered light at the photosensitive regions. The imaging device includes one or more processors configured to generate color image data based on the electrical signals from the photosensitive regions.

20 Claims, 3 Drawing Sheets

(56) References Cited

OTHER PUBLICATIONS

'en.wikipedia.org' [online] "Color filter array," Last Updated: Oct. 29, 2017, [retrieved on Feb. 13, 2018] Retrieved from Internet: URL<https://en.wikipedia.org/wiki/Color_filter_array> 5 pages.

'en.wikipedia.org' [online] "Color space," Available on or before Dec. 5, 2017, [retrieved on Feb. 13, 2018] Retrieved from Internet: URL<https://en.wikipedia.org/wiki/Color_space> via the Wayback Machine at Internet URL<https://web.archive.org/web/20171205201006/https:/en.wikipedia.org/wiki/Color_space> 5 pages.

'en.wikipedia.org' [online] "CYGM filter," Last Updated: Dec. 14, 2017, [retrieved on Feb. 13, 2018] Retrieved from Internet: URL<https://en.wikipedia.org/wild/CYGM_filter> 3 pages.

'en.wikipedia.org' [online] "CYYM filter," Last Updated: Jul. 3, 2017, [retrieved on Feb. 13, 2018] Retrieved from Internet: URL<https://en.wikipedia.org/wild/CYYM_filter> 1 page.

'en.wikipedia.org' [online] "LMS color space," Available on or before Sep. 24, 2017, [retrieved on Feb. 13, 2018] Retrieved from Internet: URLhttps://en.wikipedia.org/wiki/LMS_color_space> via the Wayback Machine at Internet URL<https://web.archive.org/web/20170924024609/https:/en.wikipedia.org/wiki/LMS_color_space> 2 pages.

'jeffmatherphotography.com' [online] "Adding L* to RGBG," Jeff Mather, May 13, 2008 [retrieved on Feb. 13, 2018] Retrieved from Internet: URL<http://jeffmatherphotography.com/dispatches/2008/05/adding-t-to-rgbg/> 1 page.

'photo.stackexchange.com' [online] "How much light and resolution is lost to color filter arrays?" Mar. 2017 [retrieved Feb. 13, 2018] Retrieved from Internet: URLhttps://photo.stackexchange.com/questions/87528/how-much-light-and-resolution-is-lost-to-color-filter-arrays> 4 pages.

'photo.stackexchange.com' [online] "What are the peak wavelengths passing through a bayer filter?" Jun. 2016 [retrieved Feb. 13, 2018] Retrieved from Internet: URL<https://photo.stackexchange.com/questions/79534/what-are-the-peak-wavelengths-passing-through-a-bayer-filter/79535> 3 pages.

'photo.stackexchange.com' [online] Why don't cameras offer more than 3 colour channels? (Or do they?) Oct. 2016 [retrieved Feb. 13, 2018] Retrieved from Internet: URL<https://photo.stackexchange.com/questions/83923/why-dont-cameras-offer-more-than-3-colour-channels-or-do-they?rq=1> 5 pages.

'www.fujifilmusa.com' [online] "CMY," Available on or before Jun. 30, 2017, [retrieved on Feb. 13, 2018] Retrieved from Internet: URL<http://www.fujifilmusa.com/products/semiconductor_materials/image-sensor-color-mosiac/cmy/index.html#applications> 2 pages.

'www.fujifilmusa.com' [online] "RGB," Available on or before Jun. 30, 2017, [retrieved on Feb. 13, 2018] Retrieved from Internet: URL<http://www.fujifilmusa.com/products/semiconductor_materials/image-sensor-color-mosiac/rgb/index.html#applications> 2 pages.

PCT International Search Report and Written Opinion issued in International Application No. PCT/US2018/049091, dated Nov. 22, 2018, 13 pages.

* cited by examiner

COLOR FILTER ARRAYS FOR IMAGE SENSORS

BACKGROUND

Many image sensors use a color filter array, such as a Bayer filter array, to distinguish between different wavelengths of light incident on the sensor. For example, a Bayer filter uses a filter pattern that is 50% green, 25% red, and 25% blue to allow the intensities of green, red, and blue light to be separately at adjacent sub-pixel photosites.

SUMMARY

In some implementations, a color filter array for an image sensor includes an array of sub-pixel filter elements that respectively pass blue, green, and yellow light. This arrangement can improve color sensitivity and improve image noise characteristics relative to traditional Bayer color filter arrays. For example, sensitivity to red and green light can be improved using yellow-filtered regions that pass both red and green light. With the yellow light passing elements of the filter, each pixel of the color filter array can pass more total light than a Bayer color filtered pixel, resulting in lower noise and/or higher resolution. This improvement can be achieved while retaining the ability to extract red, green, and blue colors, since the intensity of red light can be inferred by subtracting the measured green light intensity from the measured yellow light intensity.

In one general aspect, an imaging device includes: a color filter array arranged to filter incident light, the color filter array having a repeating pattern of color filter elements, the color filter elements including yellow filter elements, green filter elements, and blue filter elements; an image sensor having photosensitive regions corresponding to the color filter elements, the photosensitive regions being configured to respectively generate electrical signals indicative of intensity of the color-filtered light at the photosensitive regions; and a processor configured to generate color image data based on the electrical signals from the photosensitive regions.

Implementations may include one or more of the following features. For example, in some implementations, green light is substantially transmitted by 75% of the color filter elements.

In some implementations, the ratio of yellow filter elements to green filter elements to blue filter elements is 2:1:1.

In some implementations, the one or more processors are configured to provide image data indicating an array of pixels, wherein each pixel is based on electrical signals from at least one photosensitive region corresponding to a yellow color filter element, at least one photosensitive region corresponding to a green color filter element, and at least one photosensitive region corresponding to a blue color filter element.

In some implementations, the color filter elements do not include any red color filter elements or magenta color filter elements.

In some implementations, an area of the color filter array that is comprised of yellow filter elements is at least 50% of the average per-pixel color-filtered area of the color filter array.

In some implementations, 75% of the color filter elements substantially transmit green light, and only 25% of the color filter elements filter incident light to substantially transmit only green light.

In some implementations, 50% of the color filter elements substantially transmit red light, and none of the color filter elements filter incident light to substantially transmit only red light.

In some implementations, the repeating pattern comprises a grid with a repeating 2 by 2 pattern of color filter elements, and wherein each pixel of image data output by the imaging device is based on electrical signals from four photosensitive regions respectively filtered by four color filter elements, the four color filter elements including two yellow filter elements, one blue filter element, and one green filter element.

In some implementations, the two yellow filter elements are arranged diagonally across from each other in the grid, and the blue filter element and the green filter element are arranged diagonally across from each other in the grid.

In some implementations, the one or more processors are configured to provide image data having a color gamut that includes at least the sRGB color space or the Adobe RGB color space.

In some implementations, the one or more processors are configured to determine a red intensity for pixels of the image data by subtracting a green intensity from a yellow intensity.

In some implementations, the one or more processors are configured to provide the image data in values for a blue, yellow, and green color space or an LMS color space.

In some implementations, the one or more processors are configured to generate a compressed version of the image data that has a compressed form of data representing intensities of blue, yellow, and green color channels.

In some implementations, the color filter array comprises wherein the repeating pattern comprises a grid with a repeating 4 by 4 pattern of color filter elements.

In some implementations, the color filter array comprises clear elements in the repeating pattern, the clear elements being configured to pass white light to corresponding photosensitive regions of the image sensor.

In some implementations, the image sensor is a complementary metal-oxide-semiconductor (CMOS) sensor.

In some implementations, the image sensor is a charge-coupled device (CCD) sensor.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1B:
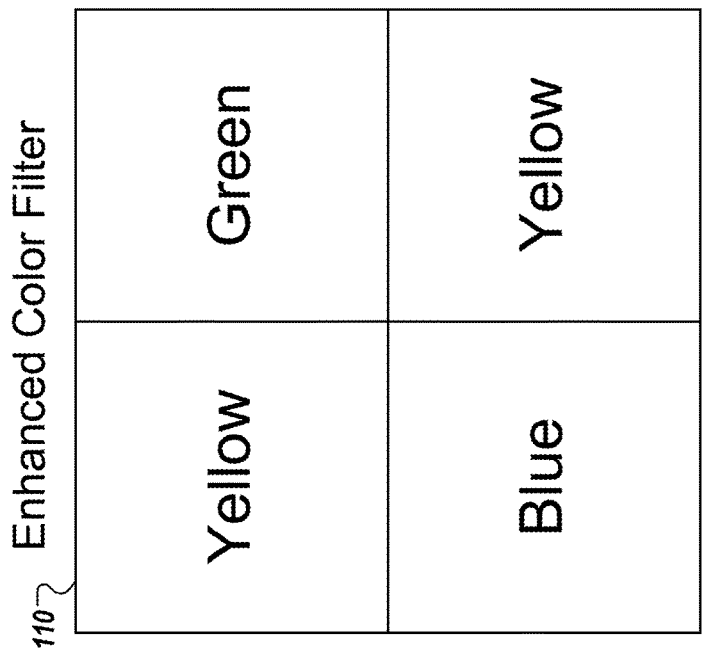
FIG. 1B is a diagram that illustrates an example of a pixel of an enhanced color filter array.
Figure 1A:
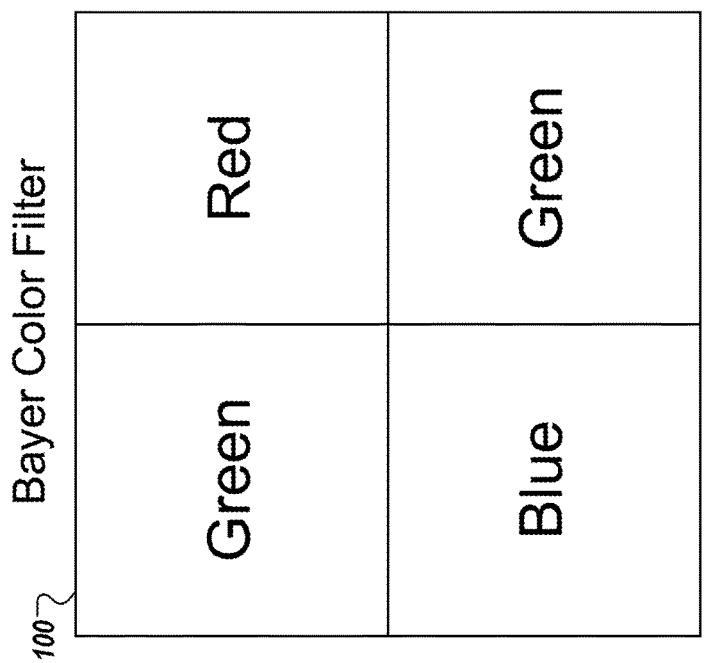
FIG. 1A is a diagram that illustrates an example of a pixel of a Bayer filter array.

FIG. 1A is a diagram that illustrates an example of a pixel 100 of a Bayer filter array. The pattern of the pixel 100 can be repeated to form a mosaic. The pixel 100 includes four filter elements arranged in a grid. Two filter elements pass green light, one passes red light, and one passes blue light. Accordingly, of the incident light to the pixel 100, 50% of the area substantially transmits green light, 25% of the area substantially transmits red light, and 25% of the area substantially transmits blue light.

FIG. 1B is a diagram that illustrates an example of a pixel 110 of an enhanced color filter array. The pattern of the pixel 110 can be repeated to form a mosaic. Like the pixel 100 of the Bayer filter, the pixel 110 includes four filter elements arranged in a grid. However, the pixel 110 includes a different set of filter elements. Two filter elements pass yellow light (e.g., substantially transmitting red and green light while substantially blocking blue light), one passes green light (e.g., substantially transmitting green light while substantially blocking red and blue light), and one passes blue light (e.g., substantially transmitting blue light while substantially blocking green and red light). As a result, of the incident light to the pixel 110, 75% of the area substantially transmits green light, 50% of the area substantially transmits red light, and 25% of the area substantially transmits blue light.

Figure 2A:
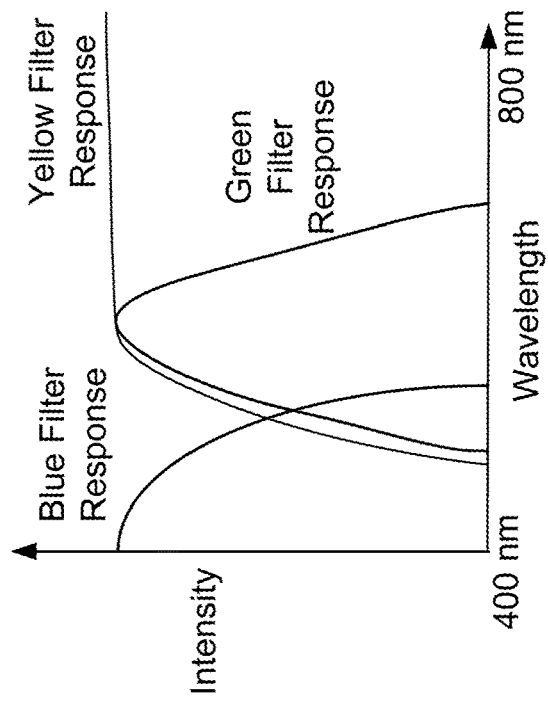
FIG. 2A illustrates a graph of example filter response characteristics for elements of a Bayer color filter array.
Figure 2B:
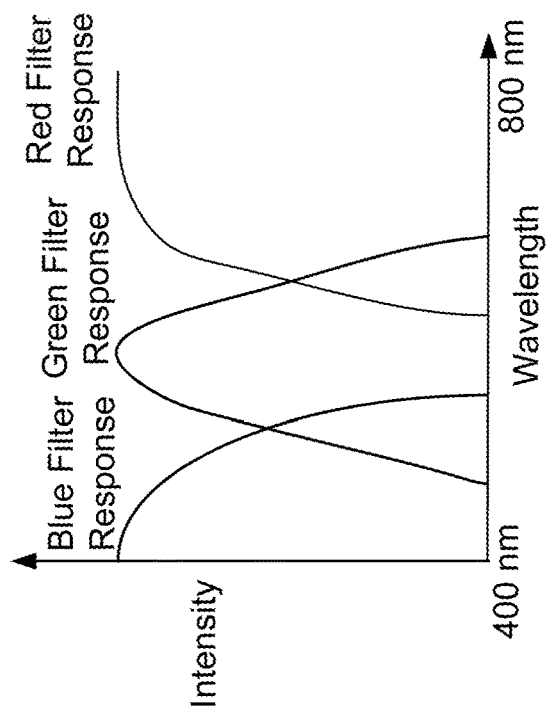
FIG. 2B illustrates a graph of example filter response characteristics for an enhanced color filter array.

The percentages noted above are based on the area of the filter array that is designed to transmit light of the different colors. Actual transmission characteristics (e.g., absolute transmission levels) will vary based on the materials of the filters. For example, a filter designed to transmit a color of light may substantially transmit light of that color, e.g., transmitting that color of light more than other colors, but may still attenuate that color to a degree, e.g., due to the non-ideal an potentially non-linear response of the filter materials. In other words, a color filter element can substantially transmit a color of light even though the response of the filter even at peak transmission wavelength is significantly less than 100%. The transmission efficiency of a filter may vary significantly from one device to another, and for filter elements for different colors. In some cases, the transmission efficiency for a transmitted color may be in the range of 20-70% for the transmitted color. Even so, the filter element may transmit the designated color more strongly than other colors. Similarly, a filter element for a particular color can substantially block light of other colors even though the filter transmits some light of the other colors. For photography and other imaging applications, the color filters for different colors have responses that overlap along the range of visible wavelengths, as shown in FIGS. 2A and 2B. The extent of overlap can be more or less than what is shown in FIGS. 2A and 2B.

Despite the overlap along some or all of the visible spectrum, a color filter is considered to substantially transmit or substantially block colors of light based on the relative responses of the filter elements. For example, although red and green filter elements may each respond to a degree to both red and green light, the red filter element transmits a greater amount of incident red light than green light, and the green filter element transmits a greater amount of incident green light than red light. Generally, at a key wavelength for a color filter, e.g., approximately 450 nm for blue, approximately 540 nm for green, and approximately 650 nm for red, the response for the color substantially passed by the filter is much more than the response for colors substantially blocked by the filter. The key wavelength may be the peak transmission wavelength for the color filter element, but is not required to be. At the key wavelengths, the difference in filter response for a filter element that substantially transmits a color of light can be much more than (e.g., twice, three times, five times, 10 times, or more) the filter response for the filter elements that substantially block that color of light. Similarly, this relationship can also exist for a color filter for the key wavelengths for the colors the filter substantially transmits and the colors the filter substantially blocks. For example, a green color filter's response at 540 nm can be twice, three times, 5 times, or ten times the response of the filter at 650 nm and at 450 nm. In general, blue filter elements respond most strongly to light in the range of approximately 400-500 nm and the key wavelength for blue light is in that range; green filter elements respond most strongly to light in the range of approximately 500-570 nm and the key wavelength for green is in that range; and red filter elements respond most strongly to light in the range of approximately 570-800 nm with the key wavelength for red in that range. As shown in FIG. 2B, a yellow filter element responds strongly to both green light and red light, e.g., having a stronger response than the blue filter for the range approximately 500-800 nm and having a much stronger response from 540 nm and longer wavelengths. These key wavelength values and wavelength ranges, as well as the charts shown in FIGS. 2A and 2B, are provided as examples. The techniques in the application are not limited to these examples and can be appropriately used with other wavelength ranges and filter response types.

The pixel 110 can be arranged as a two-by-two grid of filter elements (e.g., different filter regions), with yellow filter elements taking the place of green filter elements of a Bayer pixel 100. For example, the two yellow filter elements can be located diagonally across from each other rather than arranged side by side. In the pixel 110, a green filter element takes the place of the red filter element in the Bayer pixel 100. In general, the pixel 110 can represent a modified version of a Bayer pixel 100, in which the green filter elements have been replaced with yellow filter elements, and the red filter element has been replaced with a green filter element. The blue filter element remains, e.g., transmits blue light while substantially blocking red and green light.

In the Bayer pixel 100, green light is observed by 2 photosites. In the pixel 110, green light is observed by three photosites, which provides a 50% sensitivity improvement for green light. In the Bayer pixel 100, red light is observed by 1 photosite. In the pixel 110, red light is observed by two photosites, which provides a 100% sensitivity improvement for red light. The increase in the amount of light captured by the pixel 110 may significantly reduce image noise and/or increase image resolution.

The arrangement of the filter elements of the enhanced color filter array can produce a more natural looking noise profile in raw image data. Much of the noise in an image results from the measurement process. By capturing yellow light, e.g., both green and red light, at regions of the pixel 110, the resulting image can operate in a manner more similar to the way the human eye perceives light. The arrangement shown in the pixel 110 can achieve these benefits with minimal change to manufacturing techniques, e.g., allowing the same equipment and manufacturing techniques used for Bayer sensors to minimize cost. As noted above, a first step toward biologically compatible sensitivity is to replace a Bayer filter's green elements with yellow elements, and replace the Bayer filter's red elements with green elements.

The human eye includes cones that each detect one of three spectra: blue light, a first range of yellow-green light, and a second range of yellow green light. The arrangement of filter elements in the pixel 110 models this sensitivity better than a Bayer filter.

As an additional advantage of the enhanced color filter of the pixel 110, the character of noise can be more pleasing than with Bayer-filtered pixels. In general, noise characteristics can be more compatible with human visual perception. For example, noise tends toward green and yellow. By contrast, noise for traditional Bayer-filtered pixels often provides pixels that are strongly green or red and can be distracting. Often, the red pixels are most distracting and unnatural. In the enhanced color filter of the pixel 110, the most dominant noise perceived will be yellow, which is consistent with human visual perception and less likely to distract a viewer. In other words, human perception is accustomed to seeing the yellow noise, due to the manner in which human cones in the eye are structured.

The color filter array with repeating elements of pixel 110 does not include any red filter elements (e.g., transmitting red light), or any magenta elements (e.g., transmitting red and blue light). Nevertheless, the intensity of red light can be determined by subtracting the green intensity from the yellow intensity (e.g., an average of the two yellow-filtered regions).

In general, when subtracting one color channel from another, the effect adds noise sources (e.g., the subtraction result includes noise from both channels). The result is an increase in blurred signal-to-noise ratio (BSNR) for the red channel, with the red intensity having noise increased by a factor of the square root of two. However, when a person looks at the resulting image data, it will be processed through the human visual system's yellow receptor screens, which can perform the inverse of the operation. As a result, the increase in red channel BSNR is reduced by the visual processing of the observer, and overall the observer perceives less noise with the enhanced pixel 110 than the pixel 100. Although the processing of an imaging device may increase noise by subtracting green from yellow to infer red values, the observer will in effect add the green and yellow together again when viewing the image.

With the color filter array using pixel 110, compared to the Bayer-filtered pixel 100, luminosity will have less noise, but color noise may increase. The noise may vary depending on the color space. In the RGB color space, the results from the pixel 110 would have more red channel noise. Although there is increased sensitivity on capture of red light, the subtraction of green from yellow to infer the red intensity increases noise.

In some implementations, other color errors may result. For example, colors may not be co-located, chromatic aberrations of optics may be exacerbated, and high-frequency details at the pixel level or sub-pixel level may cause false color or unnatural results. A camera or computing system can use a number of techniques to address these issues, such as optical low-pass filtering when capturing images, or computational techniques such as the application of predictive algorithms or adjusting values based on surrounding pixels.

In the pixel 110, it can be advantageous to place the yellow-filtered elements where the green filter elements are located in a Bayer filter. Yellow intensity can be used as a proxy for luminosity. A processor of a camera or computing system can measure pixel luminosity using the yellow intensity signals generated by a sensor. The processor can then determine red and green color intensities using green-filtered regions, which are surrounded by four yellow-filtered regions each. Green and blue intensities can be determined directly from the image sensor regions corresponding to those filter elements. Then, an average can be determined for signals from two yellow-filtered regions adjacent a green-filtered region, or even for all four yellow-filtered regions adjacent the green-filtered region. The green intensity is then subtracted from the average yellow intensity to determine a red intensity.

One or more hardware data processors can be used to perform image processing. In some implementations, the color filter array is used with an imaging sensor having on the order of 10 million photosensitive regions or cells, or 50 million photosensitive regions or cells, or more. Further the system can be designed to be capable of capturing images at 60 frames per second or more.

A camera or other device can store image data generated by an image sensor with the color filter array having pixels 110 in a color space that matches the color filter elements. For example, the color space can represents images through three separate intensity channels for blue, yellow, and green (BYG). One example, is the LMS color space, which represents images through three intensity channels that generally correspond to color characteristics detected by the human eye, e.g., "long" cones sensitive to yellow light, "medium" cones sensitive to green light, and "short" cones sensitive to blue light. Although human vision may not exactly align to the color filter array (e.g., the long and medium cones both represent more of a yellow-green colors, rather than separate yellow and green elements), the representation can provide a computationally efficient and space efficient manner of storing the image data. Indeed, images can be stored in a compression format that models blue, yellow, and green intensities and their correlations and can provide a more efficient and effective compression process.

Though the color filter array does not include any pure red filter elements or even magenta filter elements (e.g., transmitting red and blue), the color filter array can nevertheless be used to provide a full range of colors (e.g., red, orange, yellow, green, blue, violet, etc.), whether or not in a color space that has a specific red color channel. In some implementations, the image data generated using the color filter array and a corresponding image sensor can have a color gamut that includes at least the sRGB color space or the Adobe RGB color space, or any other appropriate color space representing visible color.

Variations of the color filter array may be made. In some implementations, one of the yellow filter elements of the pixel 110 can be replaced by a clear element to pass white (e.g., unfiltered) light, so that the repeating 2×2 grid includes yellow, white, green and blue filter elements. This would provide a second sample of blue light in the pixel 110 and a further increase in overall sensitivity. This may provide decreased noise and/or an increase in spatial resolution.

In some implementations, the repeating pattern may be a pattern larger than a 2×2 grid. For example, a 4×4 grid of element can be used, in which there is a more balanced mix of green and yellow across the grid. The same 2:1 ratio of yellow filter elements to green filter elements can be used, but with a different arrangement of those elements. The arrangement can be such that the 4×4 grid is itself not composed of a repeating 2×2 array. Better distribution, e.g., more even distribution over a larger area may increase the resulting color accuracy of the image data.

Because the RGB color space is so common and standardized, other types of color filters and other color spaces are typically not pursued. The process of storing images in RGB involves Gamma compression mapping for each color channel. This process is very different from the processing that the human perception system uses for data generated by the eye, and it is difficult to obtain a good response for red colors. Reds and magentas can be far off using Gamma correction toward the red channel. In human vision, gamma correction is instead effectively done for yellow and green and so storing and processing images in a BYG color space can provide improvements.

Some approaches have represented images using YUV, where the U and V elements are quantized. Often, the most color information is described by the U and V components, but quantization and other issues limit the color accuracy compared to a direct BYG approach.

FIG. 2A illustrates a graph 200 of example filter response characteristics for elements of a Bayer color filter array.

FIG. 2B illustrates a graph 210 of example filter response characteristics for an enhanced color filter array. For example, the graph 210 show filter responses for blue, yellow, and green filter elements.

Figure 3:
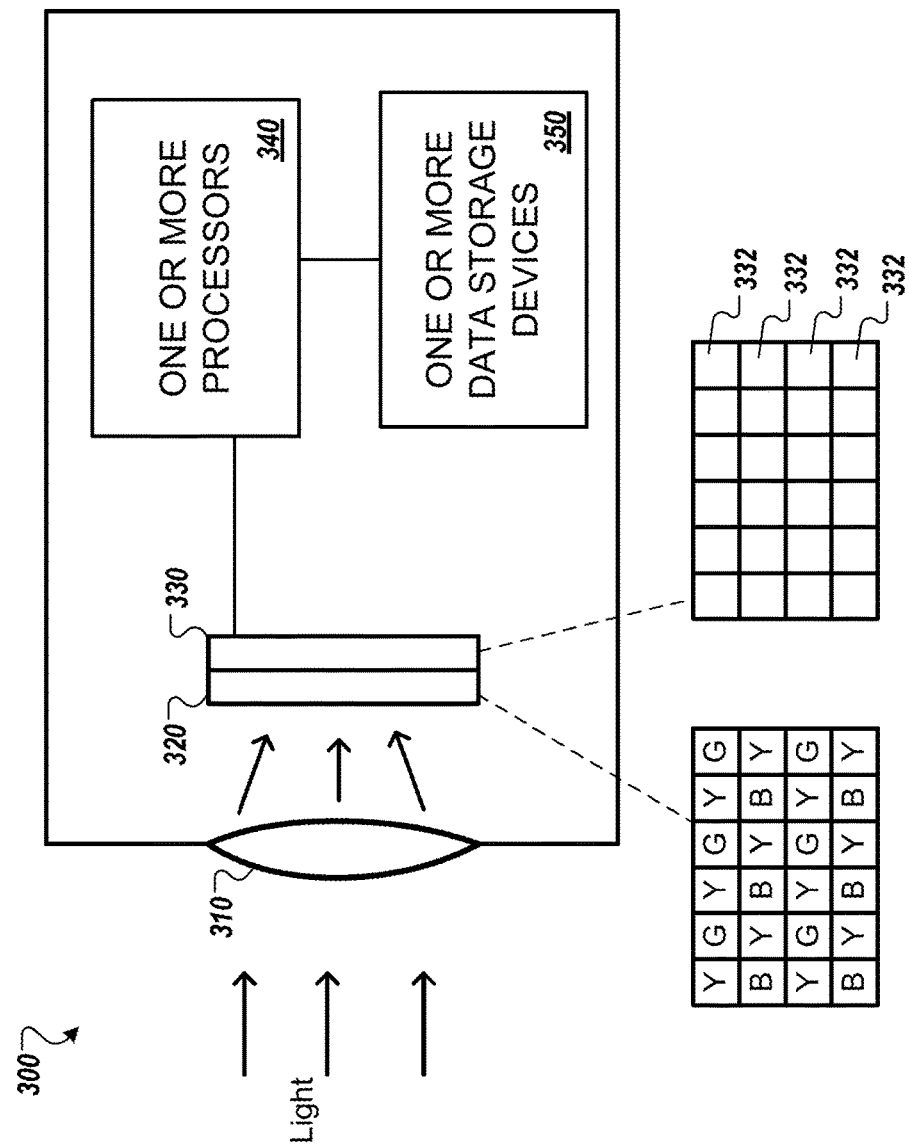
FIG. 3 illustrates an example of an imaging device using an enhanced color filter array.

FIG. 3 illustrates an example of an imaging device 300 using an enhanced color filter array 320. The imaging device includes one or more lenses 310, a color filter array 320, an image sensor 330, one or more processors 340, and one or more data storage devices 350.

A color filter array 320 having an array of pixels 110 can be used in many different types of cameras and other devices. For example, the color filter array 320 can be used in imaging modules for a mobile phone, a tablet computer, a compact camera, a mirrorless interchangeable lens camera, a digital single lens reflex camera, a security camera, a medical imaging device, and so on. The camera may be used for video capture as well as still image capture.

The color filter array 320 has a repeating pattern of color filter elements, e.g., arranged as shown for the pixel 110 of FIG. 1B, where the color filter elements including yellow filter elements, green filter elements, and blue filter elements. In some implementations, the color filter elements do not include any red filter elements (e.g., substantially transmitting red light while substantially blocking blue and green light) or magenta filter elements (e.g., filtered to transmit blue and red light while substantially blocking green light).

The imaging sensor 330 includes an array of separate photosensitive regions 332. These regions can be sub-pixel regions, e.g., with four photosensitive regions providing data representing one pixel of output image data. The color filter array 320 can be aligned with the imaging sensor 330 so that each photosensitive region receives light filtered by a single color filter element of the color filter array 320. Light passing through the one or more lenses 310 reaches the color filter array 320 so that incoming light to any given photosensitive region of the imaging sensor 330 is filtered by the corresponding color filter element for the photosensitive region.

The imaging sensor 330 generates electrical signals indicating the intensity of light at each of the photosensitive regions. These electrical signals are converted to digital form with an analog-to-digital converter (ADC), and the digital signals are provided to the one or more processors 340. The one or more processors 340 generate image data in an appropriate color space, e.g., in a BYG color space, a LMS color space, or an RGB color space. The one or more processors 340 may generate RGB image data by, for example, subtracting green intensity measured for a pixel from the average yellow intensity measured for the pixel. The one or more processors 340 store the image data in the one or more data storage devices 350, which may include flash memory or another type of data storage device.

In some implementations, the imaging device 300 operates using one or more of the following functions. The imaging device 300 receives light through the one or more lenses 310 and filters the received light with the color filter array 320. Color-filtered light from the color filter elements of the color filter array 330 is received by and detected by different photosensitive regions of the image sensor 330. The imaging device 300 produces signals indicating the intensities of light detected at the different photosensitive regions of the image sensor 330, and generates image data for a color image (e.g., a two-dimensional array of pixels) from the signals. The imaging device 330 then stores the image data in one or more data storage devices, such as internal or removable memory of the imaging device 330. The image data may specify the image elements in any of various data formats or color spaces. For example, the image data may store the data as intensities, for each pixel, for blue, yellow, and green light, e.g., in a BYG color space or LMS color space. As another example, the image data may be stored in an RGB color space, with the imaging device 300 determining the red intensity for each pixel based on subtracting a measure of detected green light from a measure of detected yellow light. One or more processors of the imaging device 300 may use appropriate de-arraying algorithms to generate the pixel values for the image data, e.g., to perform color filter array interpolation or color reconstruction.

Embodiments of the invention and all of the functional operations described in this specification may be implemented in digital electronic circuitry, or in computer software, firmware, or hardware, including the structures disclosed in this specification and their structural equivalents, or in combinations of one or more of them. Embodiments of the invention may be implemented as one or more computer program products, i.e., one or more modules of computer program instructions encoded on a computer-readable medium for execution by, or to control the operation of, data processing apparatus. The computer readable medium may be a non-transitory computer readable storage medium, a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

To provide for interaction with a user, embodiments of the invention may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the invention may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the invention, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

In each instance where an HTML file is mentioned, other file types or formats may be substituted. For instance, an HTML file may be replaced by an XML, JSON, plain text, or other types of files. Moreover, where a table or hash table is mentioned, other data structures (such as spreadsheets, relational databases, or structured files) may be used.

Thus, particular embodiments of the invention have been described. Other embodiments are within the scope of the following claims. For example, the actions recited in the claims may be performed in a different order and still achieve desirable results.

What is claimed is:

1. An imaging device comprising:
a color filter array arranged to filter incident light, the color filter array having a repeating pattern of color filter elements, the color filter elements including yellow filter elements, green filter elements, and blue filter elements;
an image sensor having photosensitive regions corresponding to the color filter elements, the photosensitive regions being configured to respectively generate electrical signals indicative of intensity of the color-filtered light at the photosensitive regions; and
one or more processors configured to generate color image data based on the electrical signals from the photosensitive regions and determine a red intensity for a pixel of the image data based on a green intensity of a first photosensitive region corresponding to a particular green filter element of the green filter elements and an average of yellow intensities of a second photosensitive region and a third photosensitive region corresponding to two particular yellow filter elements of the yellow filter elements, where the first, second, and third photosensitive regions are adjacent to each other.

2. The imaging device of claim 1, wherein green light is admitted through 75% of the color filter elements.

3. The imaging device of claim 1, wherein the ratio of yellow filter elements to green filter elements to blue filter elements is 2:1:1.

4. The imaging device of claim 1, wherein the one or more processors are configured to provide image data indicating an array of pixels, wherein each pixel is based on electrical signals from at least one photosensitive region corresponding to a yellow color filter element, at least one photosensitive region corresponding to a green color filter element, and at least one photosensitive region corresponding to a blue color filter element.

5. The imaging device of claim 1, wherein the color filter elements do not include any red color filter elements or magenta color filter elements.

6. The imaging device of claim 1, wherein an area of the color filter array that is comprised of yellow filter elements is at least 50% of the average per-pixel color-filtered area of the color filter array.

7. The imaging device of claim 1, wherein 75% of the color filter elements substantially transmit green light, and only 25% of the color filter elements filter incident light to substantially transmit only green light.

8. The imaging device of claim 7, wherein 50% of the color filter elements substantially transmit red light, and none of the color filter elements filter incident light to substantially transmit only red light.

9. The imaging device of claim 1, wherein the repeating pattern comprises a grid with a repeating 2 by 2 pattern of color filter elements, and wherein each pixel of image data output by the imaging device is based on electrical signals from four photosensitive regions respectively filtered by four color filter elements, the four color filter elements including two yellow filter elements, one blue filter element, and one green filter element.

10. The imaging device of claim 9, wherein the two yellow filter elements are arranged diagonally across from each other in the grid, and the blue filter element and the green filter element are arranged diagonally across from each other in the grid.

11. The imaging device of claim 1, wherein the one or more processors are configured to provide image data having a color gamut that includes at least the sRGB color space or the Adobe RGB color space.

12. The imaging device of claim 1, wherein the one or more processors are configured to determine a red intensity for pixels of the image data by subtracting a green intensity from a yellow intensity.

13. The imaging device of claim 1, wherein the one or more processors are configured to provide the image data in values for a blue, yellow, and green color space or an LMS color space.

14. The imaging device of claim 1, wherein the one or more processors are configured to generate a compressed version of the image data that has a compressed form of data representing intensities of blue, yellow, and green color channels.

15. The imaging device of claim 1, wherein the color filter array comprises wherein the repeating pattern comprises a grid with a repeating 4 by 4 pattern of color filter elements.

16. The imaging device of claim 1, wherein the image sensor is a CMOS sensor.

17. The imaging device of claim 1, wherein the image sensor is a CCD sensor.

18. The imaging device of claim 1, wherein the imaging device is a mobile phone.

19. The imaging device claim 1, wherein the repeating pattern comprises a repeating two by two pattern of four color filter elements including two yellow filter elements, one blue filter element, and one green filter element.

20. An imaging device comprising:
a color filter array arranged to filter incident light, the color filter array having a repeating pattern of color filter elements, the color filter elements including yellow filter elements, green filter elements, and blue filter elements;
an image sensor having photosensitive regions corresponding to the color filter elements, the photosensitive regions being configured to respectively generate electrical signals indicative of intensity of the color-filtered light at the photosensitive regions; and
one or more processors configured to generate color image data based on the electrical signals from the photosensitive regions and determine a red intensity for a pixel of the image data based on a green intensity of a first photosensitive region corresponding to a particular green filter element of the green filter elements and four yellow intensities of photosensitive regions corresponding to four particular yellow filter elements of the yellow filter elements, where the first photosensitive region is adjacent to the four photosensitive regions.

* * * * *